United States Patent
Kim et al.

(10) Patent No.: US 8,300,744 B2
(45) Date of Patent: Oct. 30, 2012

(54) APPARATUS FOR REJECTING IMAGE IN RECEIVER

(75) Inventors: Sun a Kim, Daejeon (KR); Dae-Young Yoon, Daejeon (KR); Sang-Gug Lee, Daegu (KR); Hyung-Chul Park, Daejeon (KR); Jeong-seon Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 345 days.

(21) Appl. No.: 12/695,860

(22) Filed: Jan. 28, 2010

(65) Prior Publication Data

US 2011/0182388 A1 Jul. 28, 2011

(51) Int. Cl.
*H03D 1/04* (2006.01)

(52) U.S. Cl. ........ 375/346; 375/142; 375/141; 375/130; 375/316; 370/319; 370/320; 370/321; 370/330; 370/335; 370/342; 370/347

(58) Field of Classification Search .................. 375/346, 375/142, 141, 140, 130, 316; 370/319, 320, 370/321, 330, 335, 342, 347

See application file for complete search history.

(56) References Cited

U.S. PATENT DOCUMENTS

| 2003/0174641 A1* | 9/2003 | Rahman | 370/206 |
| 2009/0196334 A1* | 8/2009 | Bai et al. | 375/226 |
| 2010/0215125 A1* | 8/2010 | Furman | 375/319 |

FOREIGN PATENT DOCUMENTS

| KR | 10-1998-0023745 A | 7/1998 |
| KR | 10-2005-0096173 A | 10/2005 |

* cited by examiner

*Primary Examiner* — Zewdu Kassa
(74) *Attorney, Agent, or Firm* — Gifford, Krass, Sprinkle, Anderson & Citkowski, P.C.

(57) ABSTRACT

The present invention relates to an apparatus for rejecting images in a receiver.
The apparatus of the present invention relates to an apparatus for rejecting image signals in a receiver of a direct conversion structure and comprises a signal mismatch compensation unit configured to detect gain error and phase error between an In-phase (I) signal and a Quadrature (Q) signal received through the receiver, to reject image signals existing in the I and Q signals, and to output a result. The signal mismatch compensation unit detects the gain error and the phase error using an adaptive step method of reducing the step size of the gain error and the phase error step by step whenever the gain error and the phase error are converged.
According to the present invention, high image rejection ratio is achieved and the adaptation time taken to obtain a high image rejection ratio is reduced simultaneously. Further, a bad influence of the DC offset on the image rejection ratio can be prevented by removing DC offset signals in a digital structure, accordingly, error can be accurately estimated.

8 Claims, 9 Drawing Sheets

APPARATUS FOR REJECTING IMAGE IN RECEIVER

BACKGROUND OF THE INVENTION

1. Field of the Invention

The present invention relates to a receiver of a direct conversion structure. More particularly, the present invention relates to an image rejection apparatus capable of rejecting an image signal interfering with an original signal using a sign-sign Least Mean Square (LMS) algorithm having an adaptive step size in the case in which there is a mismatch between In-phase (I)/Quadrature (Q) signal paths in a quadrature receiver of a direct conversion structure.

2. Description of the Related Art

In a receiver of a direct conversion structure, Radio Frequency (RF) signals are down-converted into Intermediate Frequency (IF) signals using complex I/Q mixers not having an image filtering function. During such a down-conversion process, image signals are generated in signal bands because of I/Q path gain and phase errors.

An image rejection apparatus also called a Hartley architecture, which is one of conventional techniques for rejecting image signals in the signal bands, is described below with reference to FIG. 1.

Figure 1:
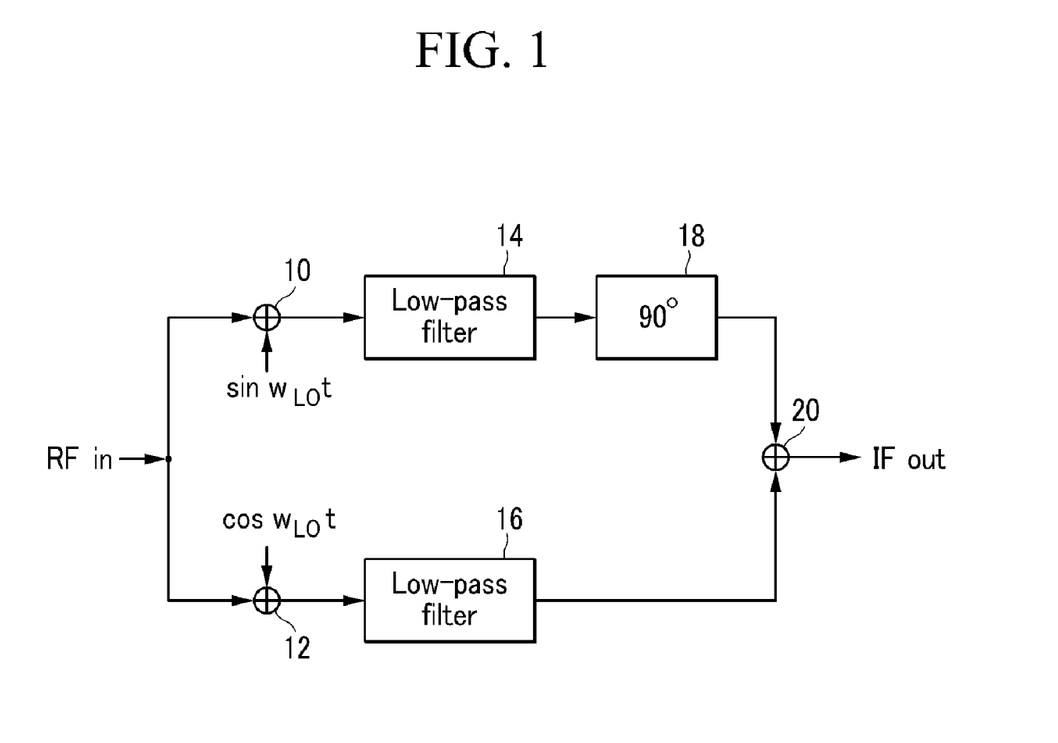
FIG. 1 is a configuration diagram of a conventional image rejection apparatus having a Hartley architecture.

FIG. 1 is a configuration diagram of the conventional image rejection apparatus having a Hartley architecture.

As shown in FIG. 1, the image rejection apparatus of a Hartley architecture includes two frequency converters 10 and 12, two low-pass filters 14 and 16, a phase shifter 18, and an adder 20.

Input radio signals RF in are down-converted into intermediate frequency signals through the two frequency converters 10 and 12. Here, the signals inputted to the frequency converters 10 and 12 are down-converted by a signal (sin $\omega_{LO}t$) of a sine waveform and a signal (cos $\omega_{LO}t$) of a cosine waveform, respectively. Accordingly, the phase difference of the signal between two paths is 90° so that the signal is divided into I and Q components.

The signals down-converted by the frequency converters 10 and 12 pass through the respective low-pass filters 14 and 16 so that high frequency components are rejected from the signals. Consequently, only intermediate frequency signals and image signals are left.

Next, the phase of the signal only in one of the two paths is shifted by 90° through the phase shifter 18. The resulting signal is added to the signal in the other of the two paths through the adder 20. Consequently, an intermediate frequency signal IF out from which the image signals have been rejected is outputted through the adder 20.

The above-described image rejection apparatus of a Hartley architecture is problematic in that image signals are not fully rejected if gain error or phase error occurs between the two paths due to variation in the process or a change in the channel because it includes analog circuits.

Figure 2:
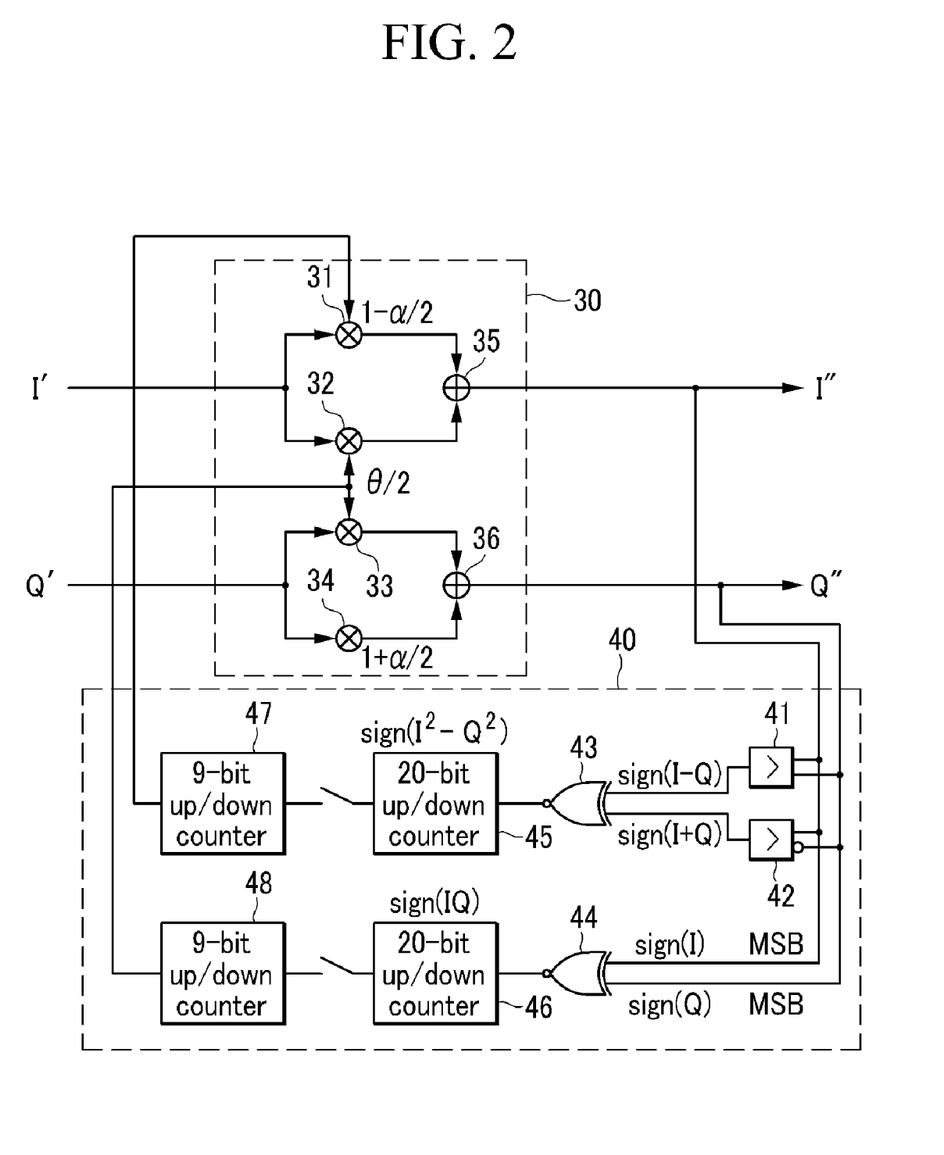
FIG. 2 is a configuration diagram of a conventional image rejection apparatus including digital circuits.

FIG. 2 is a configuration diagram of a conventional image rejection apparatus including digital circuits.

As shown in FIG. 2, the conventional image rejection apparatus consisting of digital circuits includes an image rejecter 30 and an error detector 40.

The image rejecter 30 includes four multipliers 31, 32, 33, and 34 and two adders 35 and 36. The image rejecter 30 is configured to receive I'/Q' signals (i.e., real signals of ideal I/Q signals, generated due to the occurrence of gain error or phase error because of variation in the process or a change in the channel), to restore the received I'/Q' signals to the ideal I/Q signals using the four multipliers 31, 32, 33, and 34 and the two adders 35 and 36, and then to output I"/Q" signals from which image signals have been rejected. In FIG. 2, α denotes the gain error, and θ denotes the phase error.

The image rejecter 30 requires accurate gain error and accurate phase error for the image rejection function. To accurately estimate the gain error and the phase error, the error detector 40 is used.

The error detector 40 receives the I"/Q" signals outputted from the image rejecter 30, detects gain error and phase error in the received I"/Q" signals, and feeds back the detected gain error and the detected phase error to the image rejecter 30.

To this end, the error detector 40 includes two comparators 41 and 42, two XNOR gates 43 and 44, two 20-bit up/down counters 45 and 46, and two 9-bit up/down counters 47 and 48.

The error detector 40 including the above elements finds $(I")^2 - (Q")^2$ from the received I"/Q" signals, estimates the gain error by performing low-pass filtering processing for the $(I")^2 - (Q")^2$, finds I"Q", and estimates the phase error by performing low-pass filtering processing for the I"Q".

In the error detector 40 shown in FIG. 2, the signs of $(I")^2 - (Q")^2$ and I"Q" are respectively found and used instead of $(I")^2 - (Q")^2$ and I"Q". The sign of $(I")^2 - (Q")^2$ is found by performing a sign multiplication function (for example, an XNOR operation) for the sign of (I"+Q") and the sign of (I"−Q"), and the sign of I"Q" is found by performing a sign multiplication function (for example, an XNOR operation) for the sign of I" and the sign of Q". To this end, the error detector 40 includes the two comparators 41 and 42 and the two XNOR gates 43 and 44.

Further, each of the two 20-bit up/down counters 45 and 46 performs a low-pass filtering function. The two 9-bit up/down counters 47 and 48 store the estimated gain error and the estimated phase error and feed back values thereof to the image rejecter 30.

For detailed information pertinent to FIG. 2, reference can be made to "A Complex Image Rejection Circuit with Sign Detection Only" by Supisa and Bang-Sup Song (IEEE Journal of Solid-State Circuit, Vol. 41. No. 12, December 2006).

Referring to FIG. 2, the above-described image rejection apparatus is advantageous in that it has a simple construction because simple hardware is used to reject images on signals, but is problematic in that the adaptation time is long in order to obtain a high image rejection ratio because the size of a step must be small for accurate error estimation. Further, the image rejection apparatus of FIG. 2 is configured to accumulate errors at DC and is problematic in that, if signals or offset exists at DC, the image rejection ratio is lowered because error cannot be accurately estimated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an image rejection apparatus having advantages of increasing the image rejection ratio and reducing the adaptation time taken to obtain a high image rejection ratio by solving a problem, such as imperfection in the analog structure, and a problem in which the image rejection ratio is restricted by the influence of DC components in the digital structure.

To achieve the technical object, an apparatus for rejecting images according to an aspect of the present invention is an apparatus for rejecting image signals in a receiver of a direct conversion structure and comprises a signal mismatch compensation unit configured to detect gain error and phase error between an In-phase (I) signal and a Quadrature (Q) signal received through the receiver, to reject image signals existing in the I and Q signals, and to output a result. The signal mismatch compensation unit detects the gain error and the phase error using an adaptive step method of reducing the step size of the gain error and the phase error step by step whenever the gain error and the phase error are converged.

Here, the apparatus further comprises an offset compensation unit configured to reject DC offset signals from the I and Q signals received through the receiver and to output results to the signal mismatch compensation unit.

Here, the signal mismatch compensation unit comprises an image rejecter configured to reject image signals existing in the I and Q signals, received from the offset compensation unit, and to output I" and Q" signals, and an error detector configured to detect the gain error and the phase error between the I" and Q" signals, received from the image rejecter, based on a specific step, and to output the detected gain error and the detected phase error to the image rejecter, wherein the error detector decreases the step size whenever the gain error and the phase error are converged.

According to the present invention, high image rejection ratio is achieved and the adaptation time taken to obtain a high image rejection ratio is reduced simultaneously.

Further, a bad influence of the DC offset on the image rejection ratio can be prevented by removing DC offset signals in a digital structure, accordingly, error can be accurately estimated.

DETAILED DESCRIPTION OF THE PREFERRED EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In the entire specification, unless explicitly described to the contrary, the word "comprise" and variations such as "comprises" or "comprising", will be understood to imply the inclusion of stated elements but not the exclusion of any other elements. Further, the terminologies described in the specification, such as "unit", " . . . er(or)", and "module", refer to units performing at least one function or operation, which can be implemented by hardware or software or a combination of hardware and software.

An image rejection apparatus according to an exemplary embodiment of the present invention is described below with reference to the accompanying drawings.

Figure 3:
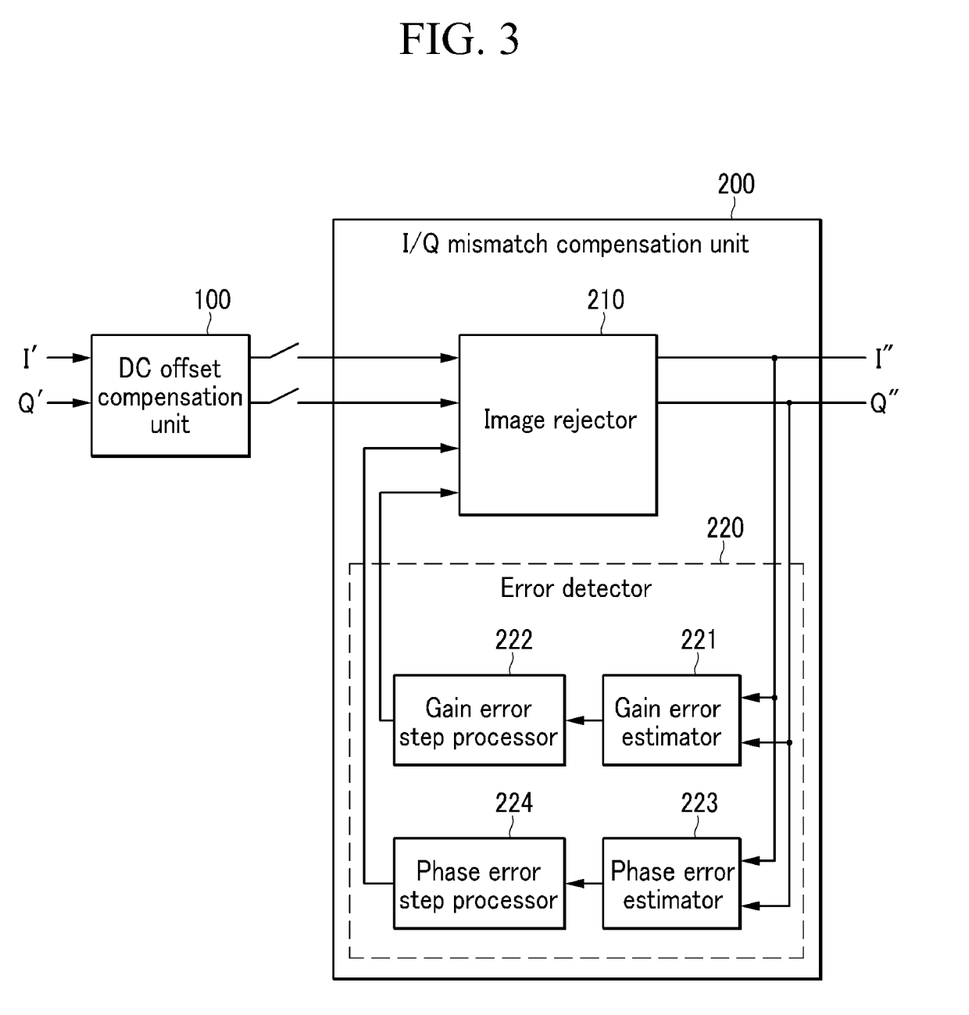
FIG. 3 is a configuration diagram of an image rejection apparatus according to an exemplary embodiment of the present invention.

FIG. 3 is a configuration diagram of the image reject apparatus according to the exemplary embodiment of the present invention.

As shown in FIG. 3, the image rejection apparatus according to the exemplary embodiment of the present invention includes a DC offset compensation unit 100 for rejecting DC offset signals existing in input signals and an I/Q mismatch compensation unit 200 for compensating for a mismatch between signals from which the DC offset signals have been rejected by the DC offset compensation unit 100.

The I/Q mismatch compensation unit 200 includes an image rejecter 210 and an error detector 220.

The image rejecter 210 receives I' and Q' signals from which DC offset signals have been rejected by the DC offset compensation unit 100, rejects image signals from the I' and Q' signals, and outputs I" and Q" signals.

The error detector 220 receives the I"/Q" signals from the image rejecter 210, estimates gain error and phase error in the I"/Q" signals, and feeds back resulting signals to the image rejecter 210. Here, through the convergence characteristic of the sign-sign LMS algorithm, the error detector 220 uses an adaptive step of rapidly estimating error by starting from a big step size and then reducing the step size whenever errors are converged.

The error detector 220 includes a gain error estimator 221, a gain error step processor 222, a phase error estimator 223, and a phase error step processor 224. The error detector 220 is described in detail later.

Figure 4:
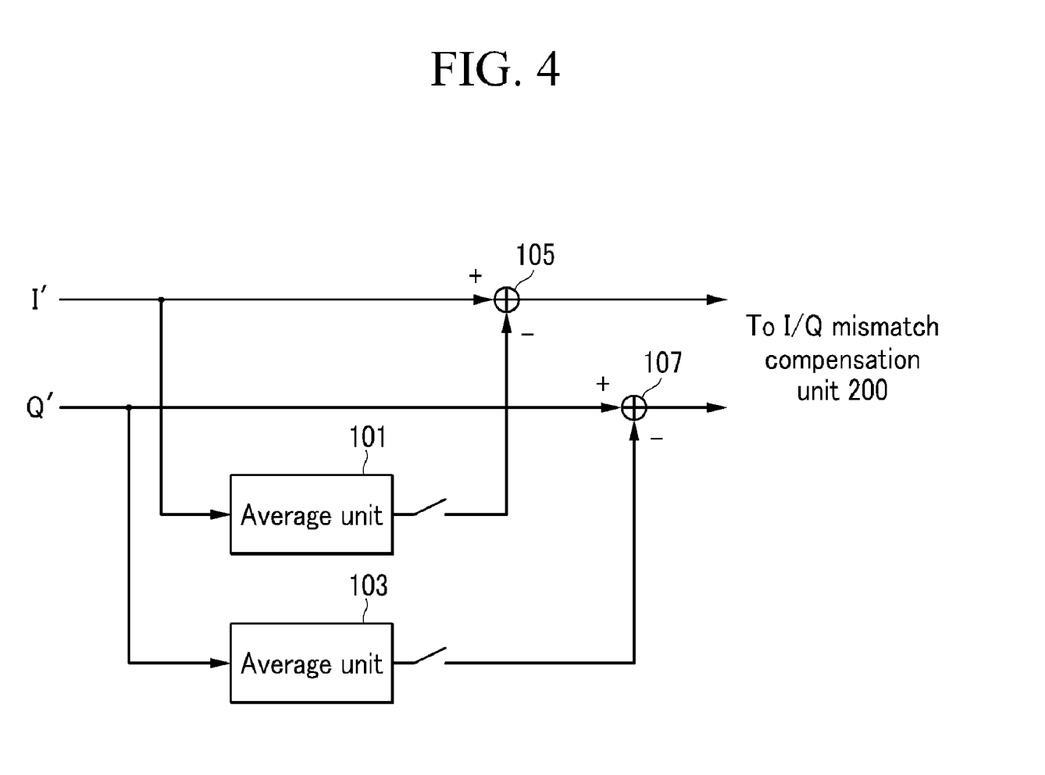
FIG. 4 is a detailed configuration diagram of a DC offset compensation unit shown in FIG. 3.

FIG. 4 is a detailed configuration diagram of the DC offset compensation unit 100 shown in FIG. 3.

As shown in FIG. 4, the DC offset compensation unit 100 includes two average units 101 and 103 and two subtractors 105 and 107.

The two average units 101 and 103 average a certain number of samples for the I' signal and a certain number of samples for the Q' signal, respectively, on a path basis and output respective estimated offset signals.

The subtractor 105 subtracts the offset signal, estimated by the average unit 101, from the I' signal, thereby being capable of rejecting DC offset components from the I' signal. The subtractor 105 outputs the I' signal from which the DC offset has been rejected to the image rejecter 210 of the I/Q mismatch compensation unit 200.

In a similar way, the subtractor 107 subtracts the offset signal, estimated by the average unit 103, from the Q' signal, thereby being capable of rejecting DC offset components from the Q' signal. The subtractor 107 outputs the Q' signal from which the DC offset components have been rejected to the image rejecter 210 of the I/Q mismatch compensation unit 200.

Figure 5:
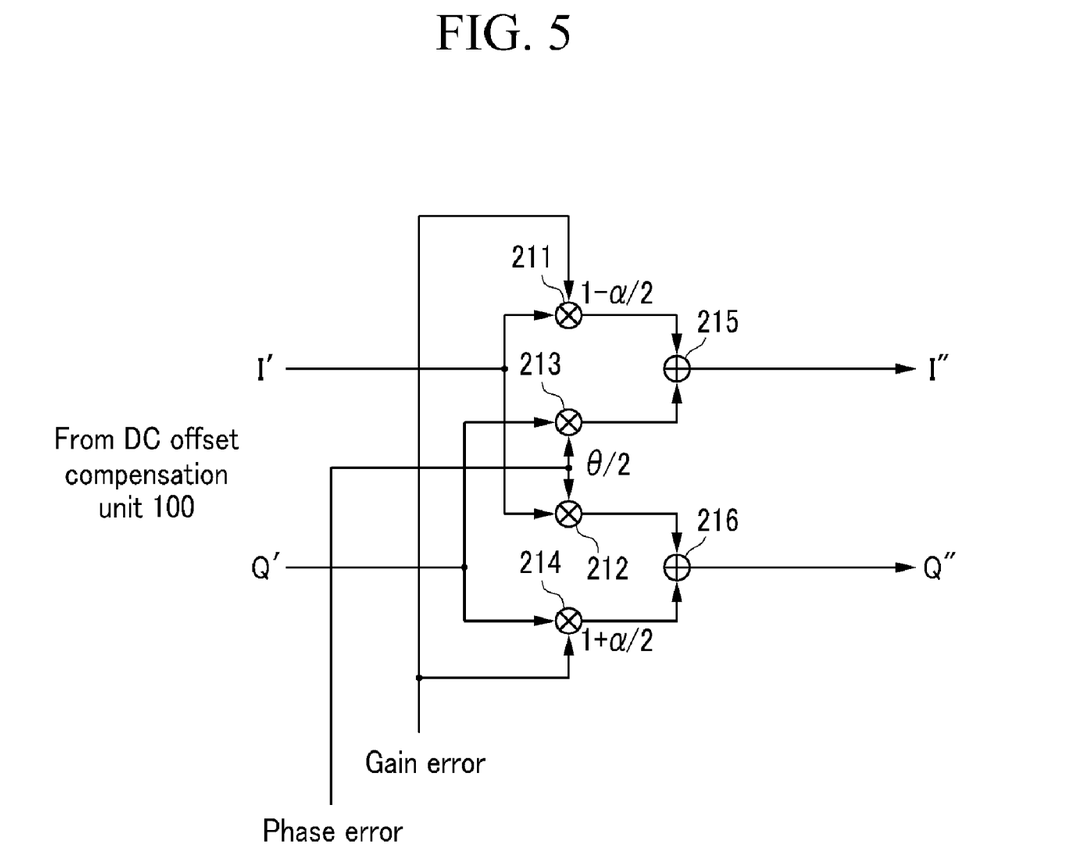
FIG. 5 is a detailed configuration diagram of an image rejecter shown in FIG. 3.

FIG. 5 is a detailed configuration diagram of the image rejecter 210 shown in FIG. 3.

The image rejecter 210 shown in FIG. 5 has the same construction as the image rejecter 30 used in the conventional image rejection apparatus of a digital structure shown in FIG. 2.

That is, the image rejecter 210 includes four multipliers 211, 212, 213, and 214 and two adder 215 and 216.

The I' and Q' signals, having the DC offset components rejected therefrom and outputted from the DC offset compensation unit 100, can be expressed in a matrix form, such as that shown in the following equation 1, using the above I and Q signals.

$$\begin{bmatrix} I' \\ Q' \end{bmatrix} = \begin{bmatrix} 1 + \frac{\alpha}{2} & -\frac{\theta}{2} \\ -\frac{\theta}{2} & 1 - \frac{\alpha}{2} \end{bmatrix} \begin{bmatrix} I \\ Q \end{bmatrix}$$ (Equation 1)

where $$\begin{bmatrix} 1 + \frac{\alpha}{2} & -\frac{\theta}{2} \\ -\frac{\theta}{2} & 1 - \frac{\alpha}{2} \end{bmatrix}$$

indicates a matrix when I and Q channels having gain error and phase error are modeled into small-signal non-ideal complex channels. Here, the gain error is indicated by $\alpha$, and the phase error is indicated by $\theta$.

The image rejecter 210 performs a function of restoring original ideal I and Q signals from the I' and Q' signals. The matrix of Equation 1 can be reversed and then displayed in a matrix form, such as that shown in the following equation 2. A construction in which such a matrix form is formed into a digital structure corresponds to the configuration diagram shown in FIG. 5.

$$\begin{bmatrix} I'' \\ Q'' \end{bmatrix} = \begin{bmatrix} 1 - \frac{\alpha}{2} & \frac{\theta}{2} \\ \frac{\theta}{2} & 1 + \frac{\alpha}{2} \end{bmatrix} \begin{bmatrix} I' \\ Q' \end{bmatrix}$$ (Equation 2)

That is, the image rejecter 210 implements the matrix of the equation 2 using the four multipliers 211, 212, 213, and 214 and the two adders 215 and 216.

In more detail, the first multiplier 211 multiplies the I' signal, received from the DC offset compensation unit 100, by $1-(\alpha/2)$ using the gain error a received from the error detector 220 and outputs a resulting signal. The second multiplier 212 multiplies the Q' signal, received from the DC offset compensation unit 100, by $\theta/2$ using the phase error $\theta$ received from the error detector 220 and outputs a resulting signal. The third multiplier 213 multiplies the I' signal, received from the DC offset compensation unit 100, by $\theta/2$ using the phase error $\theta$ received from the error detector 220 and outputs a resulting signal. The fourth multiplier 214 multiplies the Q' signal, received from the DC offset compensation unit 100, by $1+(\alpha/2)$ using the gain error a received from the error detector 220 and outputs a resulting signal.

Further, the first adder 215 adds the signals received from the first multiplier 211 and the third multiplier 213 and outputs the I" signal from which image signals have been rejected. The second adder 216 adds the signals received from the second multiplier 212 and the fourth multiplier 214 and outputs the Q" signal from which image signals have been rejected.

Figure 6:
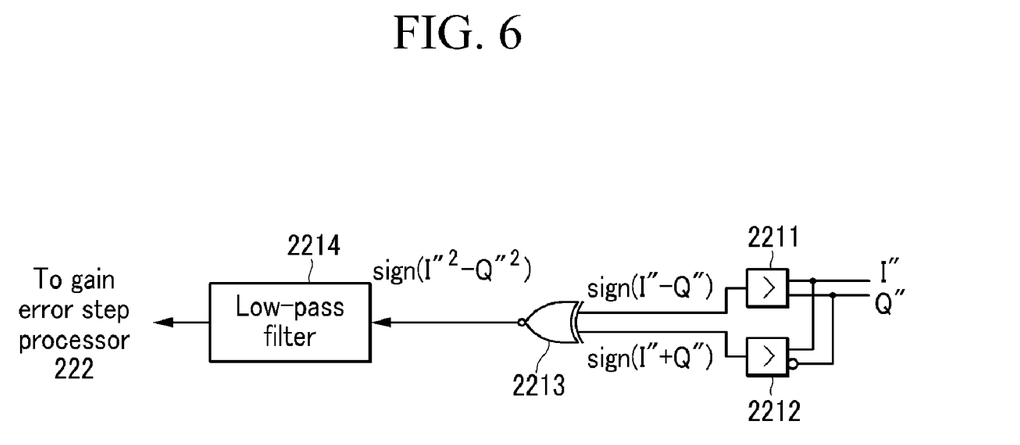
FIG. 6 is a detailed configuration diagram of a gain error estimator shown in FIG. 3.

FIG. 6 is a detailed configuration diagram of the gain error estimator 221 shown in FIG. 3.

As shown in FIG. 6, the gain error estimator 221 has a structure similar to the structure which is used in the error detector 40 of the conventional image rejection apparatus of a digital structure shown in FIG. 2.

The gain error estimator 221 includes two comparators 2211 and 2212, an XNOR gate 2213, and a low-pass filter 2214.

The comparator 2211 outputs the sign of an I"−Q" value using the I" and Q" signals received from the image rejecter 210, and the comparator 2212 outputs the sign of an I"+Q" value using the I" and Q" signals received from the image rejecter 210.

The XNOR gate 2213 performs an XNOR operation (i.e., an operation for performing a sign multiplication function) on the sign values received from the comparators 2211 and 2212 and outputs a result. That is, a value outputted from the XNOR gate 2213 corresponds to the sign value of an $(I'')^2 - (Q'')^2$ value.

The low-pass filter 2214 transmits only the low-pass components of the value received from the XNOR gate 2213 and outputs a sign value of $\alpha$ (i.e., the gain error) to the gain error step processor 222. Here, an up/down counter can be used in the low-pass filter 2214 as in the prior art.

Figure 7:
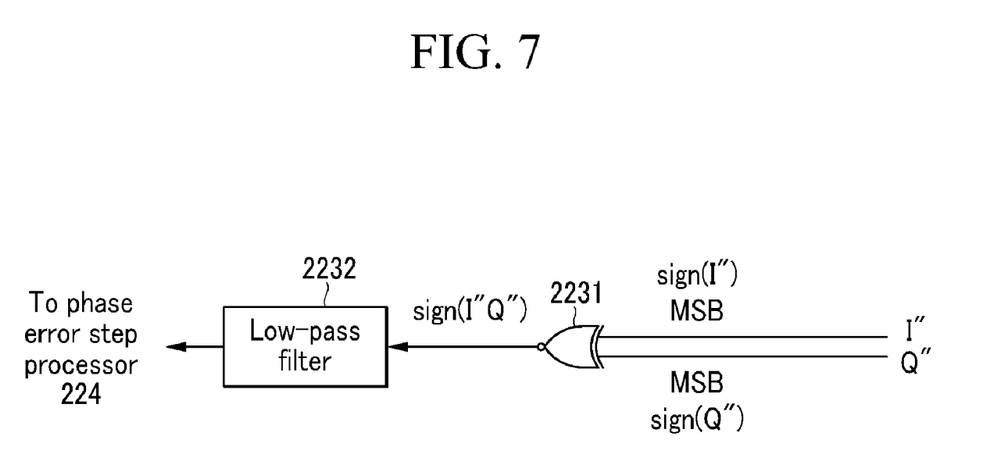
FIG. 7 is a detailed configuration diagram of a phase error estimator shown in FIG. 3.

FIG. 7 is a detailed configuration diagram of the phase error estimator 223 shown in FIG. 3.

As shown in FIG. 7, the phase error estimator 223 has a structure similar to the structure which is used in the error detector 40 of the conventional image rejection apparatus of a digital structure shown in FIG. 2.

The phase error estimator 223 includes an XNOR gate 2231 and a low-pass filter 2232.

The XNOR gate 2213 receives the I" signal and the Q" signal from the image rejecter 210, performs an XNOR operation (i.e., an operation for performing a sign multiplication function) on Most Significant Bits (MSBs) indicative of the signs of the I" signal and the Q" signal, and outputs a result. That is, a value outputted from the XNOR gate 2231 corresponds to the sign value of an I"Q" value.

The low-pass filter 2232 transmits only the low-pass components of the value received from the XNOR gate 2231 and outputs an sign value of $-\theta$ for $\theta$ (i.e., the phase error) to the phase error step processor 224. Here, as in the prior art, an up/down counter can be used as the low-pass filter 2232.

Figure 8:
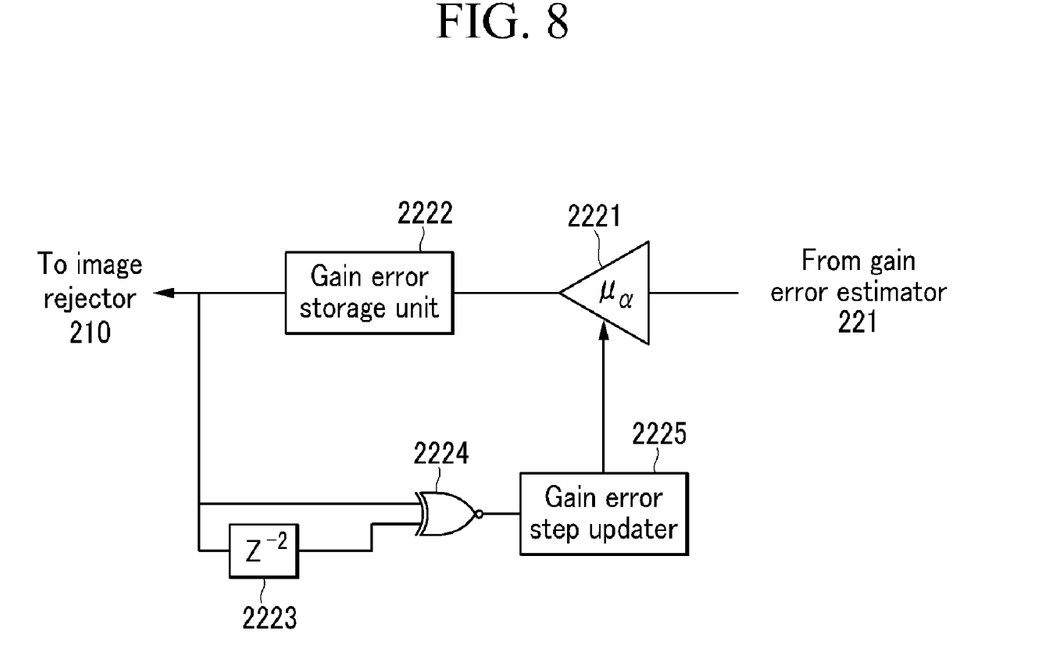
FIG. 8 is a detailed configuration diagram of a gain error step processor shown in FIG. 3.

FIG. 8 is a detailed configuration diagram of the gain error step processor 222 shown in FIG. 3.

As shown in FIG. 8, the gain error step processor 222 includes an amplifier 2221, a gain error storage unit 2222, a time delay unit 2223, an XNOR gate 2224, and a gain error step updater 2225.

The amplifier 2221 amplifies the sign value (i.e., the gain error) received from the gain error estimator 221 to have the step size $\mu_\alpha$ and outputs a result. That is, the amplifier 2221 outputs a value $\mu_\alpha$ when the sign of the gain error is a positive number and outputs a value $-\mu_\alpha$ when the sign of the gain error is a negative number.

The gain error storage unit 2222 stores the gain error received from the amplifier 2221. Accordingly, a gain error stored in a previous loop is updated to a new gain error and then stored. A register can be used as the gain error storage unit 2222.

The gain error stored in the gain error storage unit 2222 is fed back to the image rejecter 210. The image rejecter 210 uses the gain error to reject image signals existing in the I'/Q' signals and to output the I"/Q" signals.

The time delay unit 2223 delays the gain error, outputted from the gain error storage unit 2222, during two loops and outputs a result.

The XNOR gate 2224 performs an XNOR operation on the gain error, received from the gain error storage unit 2222, and the gain error, received from the time delay unit 2223, and outputs an operation result. That is, in the operation of the XNOR gate 2224, a new gain error and an old gain error estimated before two loops are compared with each other, and a result is outputted.

The gain error step updater 2225 updates the size of the step $\mu_\alpha$ which is used in the amplifier 2221 based on a value received from the XNOR gate 2224. In other words, if an output value of the XNOR gate 2224 indicates that the new gain error and the old gain error are identical with each other, it means that the estimated gain errors are converged. Accordingly, the gain error step updater 2225 reduces the step size $\mu_\alpha$ in a next loop and outputs the reduced step size $\mu_\alpha$ to the amplifier 2221. Accordingly, the gain error step updater 2225 stores the gain error step $\mu_\alpha$, which is updated until a next convergence appears, and supplies an updated gain error step to the amplifier 2221.

As described above, the gain error step processor 222 according to the exemplary embodiment of the present invention uses an adaptive step method of starting from a big step size and then gradually decreasing the step size whenever a convergence occurs. Accordingly, the adaptation speed of an algorithm for rejecting image signals can be improved. Further, gain error can be accurately estimated and correction can be performed based on such estimation because the gain error is estimated using the smallest step size finally.

Figure 9:
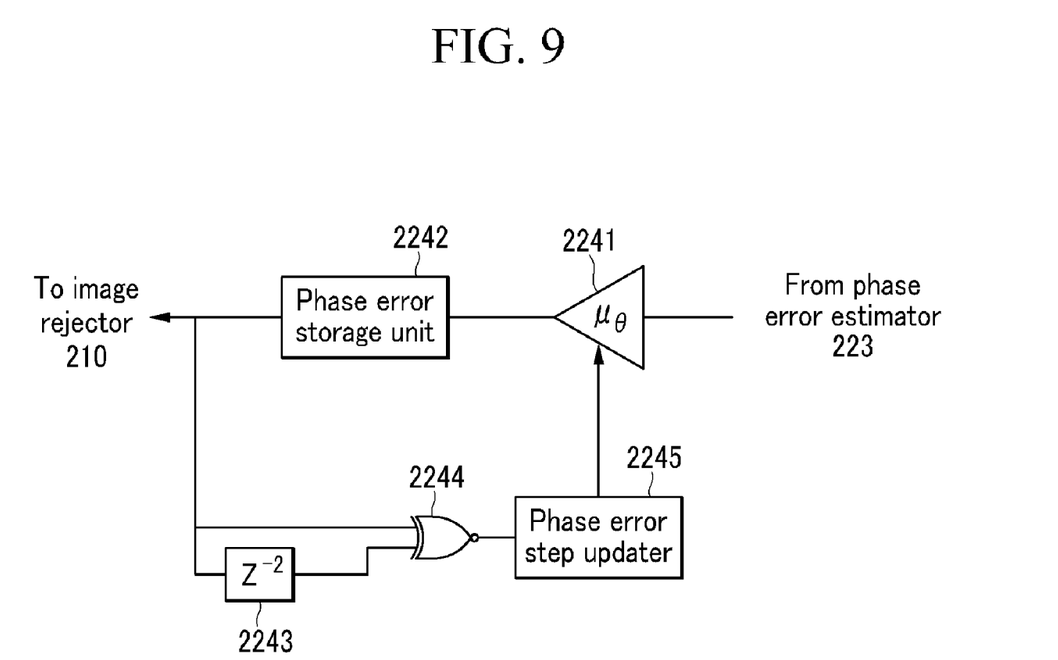
FIG. 9 is a detailed configuration diagram of a phase error step processor shown in FIG. 3.

FIG. 9 is a detailed configuration diagram of the phase error step processor 224 shown in FIG. 3.

The phase error step processor 224 shown in FIG. 9 has a similar construction to the gain error step processor 222 shown in FIG. 8. For the general construction or operation of the phase error step processor 224, reference can be made to the gain error step processor 222 shown in FIG. 8, and so the phase error step processor 224 is described in short for convenience of description.

The phase error step processor 224 includes an amplifier 2241, a phase error storage unit 2242, a time delay unit 2243, an XNOR gate 2244, and a phase error step updater 2245.

The amplifier 2241 amplifies the opposite sign value of the phase error, received from the phase error estimator 223, in the size of a step $\mu_\theta$ and outputs a result. That is, the amplifier 2241 outputs a value—$\mu_\theta$ when the sign of the phase error is a positive number and outputs a value $\mu_\theta$ when the sign of the phase error is a negative number.

The phase error storage 2242 stores the phase error received from the amplifier 2241. Accordingly, a phase error stored in a previous loop is updated to a new phase error and then stored. A register can be used as the phase error storage 2242.

The phase error stored in the phase error storage 2242 is fed back to the image rejecter 210. The image rejecter 210 uses the phase error to reject image signals existing in the I'/Q' signals and to output the I"/Q" signals.

The time delay unit 2243 delays the phase error received from the phase error storage 2242 during two loops and outputs a result.

The XNOR gate 2244 performs an XNOR operation on the phase error, received from the phase error storage unit 2242, and the phase error, received from the time delay unit 2243, and outputs an operation result. That is, in the operation of the XNOR gate 2244, a new phase error and an old phase error estimated before two loops are compared with each other, and a result is outputted.

The phase error step updater 2245 updates the step size $\mu_\theta$ which is used in the amplifier 2241 based on a value received from the XNOR gate 2244. In other words, if an output value of the XNOR gate 2244 indicates that the new phase error and the old phase error are identical with each other, it means that the estimated phase errors are converged. Accordingly, the phase error step updater 2245 reduces the step size $\mu_\theta$ in a next loop and outputs the reduced step size $\mu_\theta$ to the amplifier 2241. Accordingly, the phase error step updater 2245 stores the phase error step $\mu_\theta$, which is updated until a next convergence appears, and supplies an updated phase error step to the amplifier 2241.

As described above, the phase error step processor 224 according to the exemplary embodiment of the present invention uses an adaptive step method of starting from a big step size and then gradually decreasing the step size whenever a convergence occurs. Accordingly, the adaptation speed of an algorithm for rejecting image signals can be improved. Further, phase error can be accurately estimated and correction can be performed based on such estimation because the phase error is estimated using the smallest step size finally.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. An apparatus for rejecting image signals in a receiver of a direct conversion structure, the apparatus comprising:
    a signal mismatch compensation unit configured to detect gain error and phase error between an In-phase (I) signal and a Quadrature (Q) signal received through the receiver, to reject image signals existing in the I and Q signals, and to output a result,
    wherein the signal mismatch compensation unit detects the gain error and the phase error using an adaptive step method of reducing the step size of the gain error and the phase error step by step whenever the gain error and the phase error are converged,
    wherein the apparatus further comprises an offset compensation unit configured to reject DC offset signals from the I and Q signals received through the receiver and to output results to the signal mismatch compensation unit,
    wherein the offset compensation unit comprises two average units for estimating offset signals by taking a certain number of samples for the received I and Q signals; and two subtractors for subtracting the offset signals, estimated by the two the average units, from the respective I and Q signals and outputting I and Q signals from which the DC offset signals have been rejected,
    wherein the signal mismatch compensation unit comprises an image rejecter configured to reject image signals existing in the I and Q signals, received from the offset compensation unit, and to output I" and Q" signals; and an error detector configured to detect the gain error and the phase error between the I" and Q" signals, received from the image rejecter, based on a specific step, and to output the detected gain error and the detected phase error to the image rejecter, wherein the error detector decreases a step size whenever the gain error and the phase error are converged, and
    wherein the error detector comprises a gain error estimator configured to receive the I" and Q" signals from the image rejecter and to output a sign value of $(I")^2-(Q")^2$; a phase error estimator configured to receive the I" and Q" signals from the image rejecter and to output a sign value of I"Q"; a gain error step processor configured to amplify the sign value, estimated by the gain error estimator, in a first step size and to output the amplified sign value to the image rejecter as the gain error, the gain error step processor performing the adaptive step method of gradually reducing the first step size whenever the gain error between certain periods of time is converged; and a phase error step processor configured to amplify the sign value, estimated by the phase error estimator, in a second step size and to output the amplified sign value to the image rejecter as the phase error, the phase error step processor performing the adaptive step method of gradually reducing the second step size whenever the phase error between certain periods of time is converged.

2. The apparatus of claim 1, wherein the I and Q signals received through the receiver are signals of original signals having the gain error and the phase error, received through respective I and Q channels, and the image rejecter
rejects the image signals from the I and Q signals, received from the offset compensation unit, using an inverted matrix of a matrix when the I and Q channels are modeled into small-signal non-ideal complex channels.

3. The apparatus of claim 1, wherein the gain error estimator comprises:
a first comparator configured to compare the I″ and Q″ signals received from the image rejecter and to output a sign value of I″−Q″;
a second comparator configured to compare the I″ and Q″ signals received from the image rejecter and to output a sign value of I″+Q″;
a first XNOR gate configured to perform an XNOR operation on the sign values received from the first and second comparators and to output the sign value of $(I'')^2-(Q'')^2$ as a result; and
a first low-pass filter configured to perform low-pass filtering on the result received from the first XNOR gate.

4. The apparatus of claim 3, wherein the phase error estimator comprises:
a second XNOR gate configured to perform an XNOR operation on Most Significant Bits (MSB) of the respective I″ and Q″ signals received from the image rejecter and to output the sign value of I″Q″ as a result; and
a second low-pass filter configured to perform low-pass filtering on the result received from the second XNOR gate.

5. The apparatus of claim 4, wherein the gain error step processor comprises:

a first amplifier configured to amplify the output value of the gain error estimator in the first step size and to output a result;
a first gain error storage unit configured to store the result of the first amplifier as the gain error and to simultaneously output the gain error to the image rejecter;
a first time delay unit configured to delay the gain error, stored in the first gain error storage unit, for a certain period of time and to output a delayed result;
a third XNOR gate configured to perform an XNOR operation on the gain error, received from the first time delay unit, and the gain error, received from the first gain error storage unit, and to output an operation result; and
a first gain error step updater configured to update the first step size based on the operation result of the third XNOR gate.

6. The apparatus of claim 5, wherein in a case in which the operation result of the third XNOR operator indicates that the gain error outputted from the first time delay unit is identical with the gain error outputted from the first gain error storage unit and the gain errors are determined to be converged, the first gain error step updater updates the first step size.

7. The apparatus of claim 3, wherein the phase error step processor comprises:
a second amplifier configured to amplify the output value of the phase error estimator in the second step size and to output a result;
a second phase error storage unit configured to store the result of the second amplifier as the phase error and to simultaneously output the phase error to the image rejecter;
a second time delay unit configured to delay the phase error, stored in the second phase error storage unit, for a certain period of time and to output a delayed result;
a fourth XNOR gate configured to perform an XNOR operation on the phase error, received from the second time delay unit, and the phase error, received from the second phase error storage unit, and to output an operation result; and
a second phase error step updater configured to update the second step size based on the operation result of the fourth XNOR gate.

8. The apparatus of claim 7, wherein in a case in which the operation result of the fourth XNOR operator indicates that the phase error outputted from the second time delay unit is identical with the phase error outputted from the second phase error storage unit and the phase errors are determined to be converged, the second phase error step updater updates the second step size.

* * * * *